(12) United States Patent
Mimura

(10) Patent No.: US 11,764,755 B2
(45) Date of Patent: Sep. 19, 2023

(54) ELASTIC WAVE DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventor: Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1292 days.

(21) Appl. No.: 16/240,836

(22) Filed: Jan. 7, 2019

(65) Prior Publication Data

US 2019/0245510 A1 Aug. 8, 2019

(30) Foreign Application Priority Data

Feb. 7, 2018 (JP) .................................. 2018-020184

(51) Int. Cl.
*H03H 9/02* (2006.01)
*H03H 9/17* (2006.01)
(Continued)

(52) U.S. Cl.
CPC ........ *H03H 9/175* (2013.01); *H03H 9/02157* (2013.01); *H03H 9/02228* (2013.01); *H03H 9/02559* (2013.01); *H03H 9/02929* (2013.01); *H03H 9/14538* (2013.01); *H10N 30/06* (2023.02); *H10N 30/072* (2023.02); *H03H 9/058* (2013.01)

(58) Field of Classification Search
CPC ..... H03H 9/175; H03H 9/058; H03H 9/02535

USPC ...... 310/313 R, 313 A, 313 B, 313 C, 313 D
See application file for complete search history.

(56) References Cited

U.S. PATENT DOCUMENTS

| 2004/0140869 | A1 | 7/2004 | Marksteiner et al. |
| 2006/0043822 | A1* | 3/2006 | Yokota ................... H03H 9/059 |
| | | | 310/313 R |

(Continued)

FOREIGN PATENT DOCUMENTS

| CN | 103283147 A | 9/2013 |
| CN | 104205629 A | 12/2014 |

(Continued)

OTHER PUBLICATIONS

Yariv et al., "Optical Waves in Crystals—Propagation and Control of Laser Radiation, Chapter 6.2. Periodic Layered Media", Wiley-Interscience Publication, 1984, 3 pages.

(Continued)

*Primary Examiner* — Derek J Rosenau
(74) *Attorney, Agent, or Firm* — KEATING & BENNETT, LLP

(57) ABSTRACT

An elastic wave device using the S0 mode of plate waves includes a support substrate, an acoustic reflective layer laminated on the support substrate, a piezoelectric body laminated on the acoustic reflective layer, and an IDT electrode disposed on the piezoelectric body. In the acoustic reflective layer, T1+T2 is between about 0.40 and about 0.60 inclusive in a portion in which low and high acoustic impedance layers are adjacent in the laminating direction. T1 is the thickness of the low acoustic impedance layers. T2 is the thickness of the high acoustic impedance layers. T1/(T1+T2) is between about 0.35 and about 0.65 inclusive.

16 Claims, 12 Drawing Sheets

(51) Int. Cl.
*H03H 9/145* (2006.01)
*H10N 30/06* (2023.01)
*H10N 30/072* (2023.01)
*H03H 9/05* (2006.01)

(56) References Cited

U.S. PATENT DOCUMENTS

| | | | | |
|---|---|---|---|---|
| 2014/0152146 A1* | 6/2014 | Kimura | ............ | H03H 9/02535 |
| | | | | 29/25.35 |
| 2014/0225684 A1* | 8/2014 | Kando | ............ | H03H 9/14594 |
| | | | | 333/195 |
| 2015/0028720 A1* | 1/2015 | Kando | ............ | H01L 41/1873 |
| | | | | 156/230 |
| 2018/0097500 A1 | 4/2018 | Mimura | | |
| 2018/0205361 A1 | 7/2018 | Kishimoto et al. | | |
| 2018/0205362 A1 | 7/2018 | Kishimoto et al. | | |

FOREIGN PATENT DOCUMENTS

| | | |
|---|---|---|
| KR | 10-2017-0136598 A | 12/2017 |
| WO | 2007/060557 A1 | 5/2007 |
| WO | 2017/068827 A1 | 4/2017 |
| WO | 2017/068828 A1 | 4/2017 |

OTHER PUBLICATIONS

Yariv et al., "Optical Waves in Crystals—Propagation and Control of Laser Radiation, Chapter 11.2. TE and TM Modes in an Asymmetric Waveguide, B-V Diagram", A Wiley-Interscience Publication, 1984, pp. 420.

First Office Action in CN201811617295.1, dated Oct. 24, 2022, 7 pages.

* cited by examiner

ELASTIC WAVE DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2018-020184 filed on Feb. 7, 2018. The entire contents of this application are hereby incorporated herein by reference.

BACKGROUND OF THE INVENTION

1. Field of the Invention

The present invention relates to an elastic wave device using the S0 mode of plate waves, and to a radio-frequency front-end circuit and a communication apparatus which include the elastic wave device.

2. Description of the Related Art

In the related art, various elastic wave devices using plate waves have been proposed. In an elastic wave device described in WO 2017/068827, a piezoelectric body is laminated on a support substrate with an acoustic reflective layer interposed therebetween. An interdigital transducer (IDT) electrode is disposed on the piezoelectric body. The acoustic reflective layer includes low acoustic impedance layers and high acoustic impedance layers. The acoustic reflective layer causes plate waves propagating in the piezoelectric body to be confined at least in the piezoelectric body. In the elastic wave device described in WO 2017/068827, the S0 mode, the A0 mode, the A1 mode, the SH0 mode, the SH1 mode, and the like are described as the mode of the plate waves described above.

The inventor of preferred embodiments of the present invention discovered that, in the case in which the elastic wave device described in WO 2017/068827 is a resonator, a spurious response appears near the resonant frequency or the anti-resonant frequency, and that, in the case in which the elastic wave device is a band pass filter, a spurious response appears near the pass band. The inventors of preferred embodiments of the present invention also discovered that the reflectivity of the acoustic reflective layer sometimes decreases, causing an increase in the loss.

SUMMARY OF THE INVENTION

Preferred embodiments of the present invention provide low-loss elastic wave devices each using the S0-mode of plate waves. The elastic wave devices make it difficult for a spurious response to appear near the resonant frequency or the anti-resonant frequency in the case in which the elastic wave devices are resonators, and near the pass band in the case in which the elastic wave devices are filters, and radio-frequency front-end circuits and communication apparatuses which each include an elastic wave device.

According to a preferred embodiment of the present invention, an elastic wave device using an S0 mode of a plate wave is provided. The elastic wave device includes a support substrate, an acoustic reflective layer that is laminated directly or indirectly on the support substrate, a piezoelectric body that is laminated directly or indirectly on the acoustic reflective layer, and an IDT electrode that is disposed directly or indirectly on the piezoelectric body. The acoustic reflective layer includes at least one low acoustic impedance layer whose acoustic impedance is relatively low, and at least one high acoustic impedance layer whose acoustic impedance is relatively high. In the acoustic reflective layer, T1+T2 is between about 0.40 and about 0.60 inclusive in at least one portion in which the low acoustic impedance layer is adjacent to the high acoustic impedance layer in a laminating direction, where T1 is a thickness of the low acoustic impedance layer and T2 is a thickness of the high acoustic impedance layer. The thickness of the low acoustic impedance layer is normalized by a thickness-direction component of a wavelength of a traverse bulk wave propagating in the low acoustic impedance layer at an operating frequency of the elastic wave device. The thickness of the high acoustic impedance layer is normalized by a thickness-direction component of a wavelength of a traverse bulk wave propagating in the high acoustic impedance layer at the operating frequency of the elastic wave device. T1/(T1+T2) is between about 0.35 and about 0.65 inclusive.

According to a preferred embodiment of the present invention, an elastic wave device is an elastic wave resonator, and the operating frequency of the elastic wave device is a resonant frequency of the elastic wave resonator. In this case, a spurious response is difficult to appear near the resonant frequency or the anti-resonant frequency.

According to a preferred embodiment of the present invention, an elastic wave device is a band pass elastic wave filter, and the operating frequency of the elastic wave device is a center frequency of a pass band of the elastic wave filter. In this case, a spurious response is difficult to appear in and near the pass band.

According to a preferred embodiment of the present invention, the at least one low acoustic impedance layer includes a plurality of low acoustic impedance layers.

According to a preferred embodiment of the present invention, the at least one high acoustic impedance layer includes a plurality of high acoustic impedance layers.

According to a preferred embodiment of the present invention, the plurality of low acoustic impedance layers have the same or substantially the same acoustic impedance. In this case, the same material may be used to easily provide multiple low acoustic impedance layers.

According to a preferred embodiment of the present invention, the plurality of the high acoustic impedance layers have the same or substantially the same acoustic impedance. In this case, the same material may be used to easily provide multiple high acoustic impedance layers.

According to a preferred embodiment of the present invention, the piezoelectric body is made of lithium niobate. In this case, the electromechanical coupling coefficient in the S0 mode is increased.

According to a preferred embodiment of the present invention, Euler angles of the piezoelectric body fall substantially within (within a range of about 0°±5°, about 0° to about 150°, within a range of about 90°±10°), (within a range of about 30°±5°, within a range of about 90°±10°, about 35° to about) 180°, or (within a range of about 30°±5°, within a range of about 90°±10°, about 0° to about 5°). In this case, the electromechanical coupling coefficient of the S0 mode of plate waves is improved, thus achieving further improvement in low loss.

According to a preferred embodiment of the present invention, a radio-frequency front-end circuit includes an elastic wave filter including an elastic wave device according to a preferred embodiment of the present invention, and a power amplifier that is connected to the elastic wave filter.

According to a preferred embodiment of the present invention, a communication apparatus includes a radio-frequency front-end circuit according to a preferred embodiment of the present invention, and an RF signal processing circuit.

Preferred embodiments of the present invention provide low-loss elastic wave devices each using the S0 mode of plate waves. In the elastic wave devices, a spurious response is difficult to appear near the resonant frequency or the anti-resonant frequency in the case of a resonator, and in and near the pass band in the case of a filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

It is to be noted that the preferred embodiments described in the specification are exemplary and that the configurations may be partially replaced or combined with each other between different preferred embodiments.

Figure 1A:
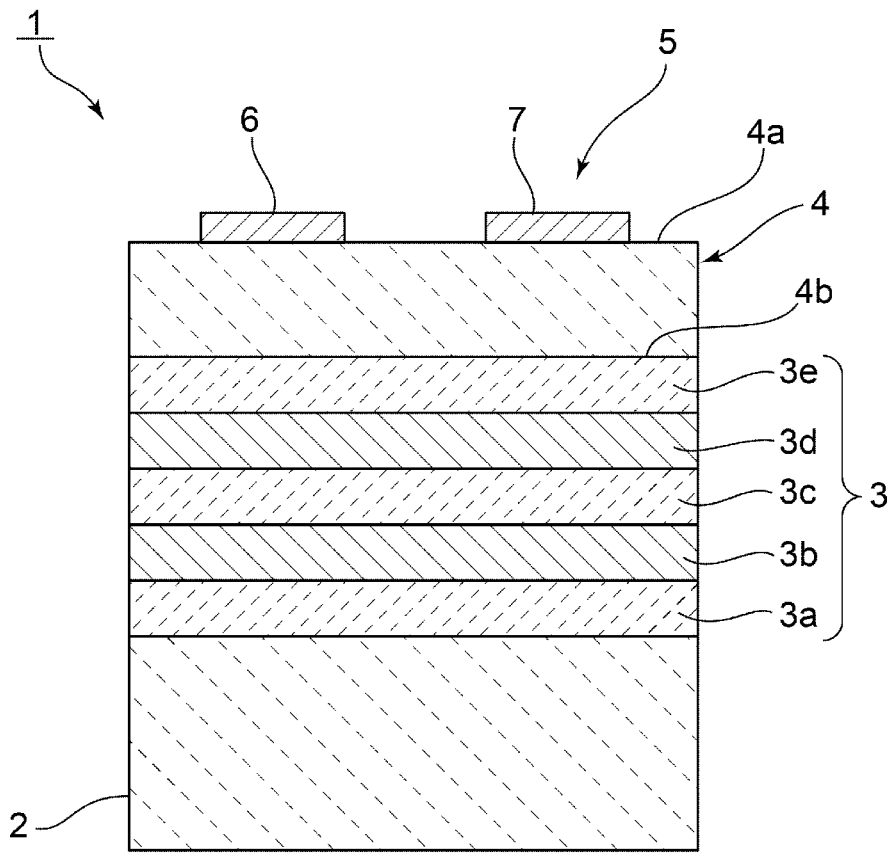
FIG. 1A is a partial front sectional view of a principal portion of an elastic wave device according to a first preferred embodiment of the present invention.
Figure 1B:
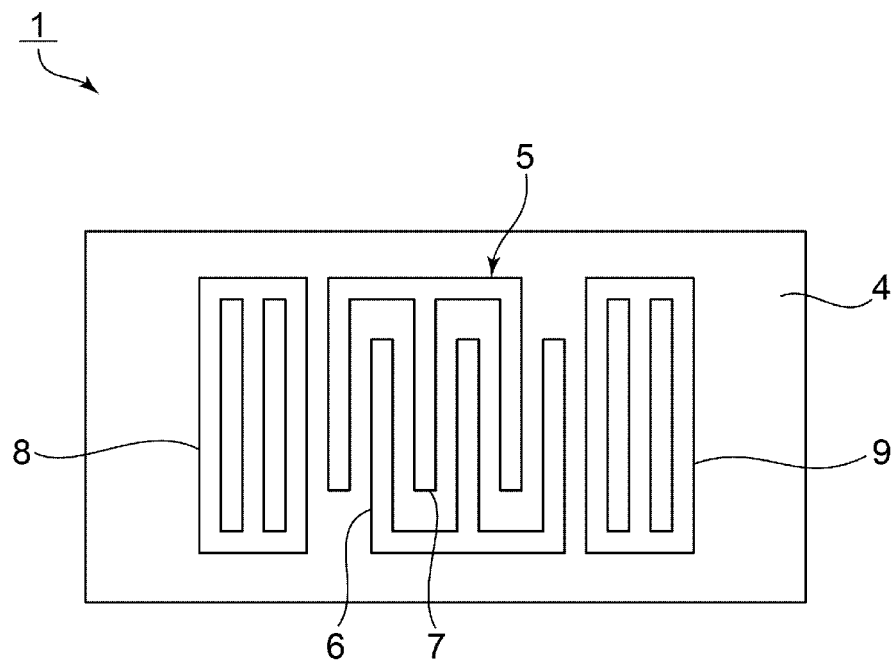
FIG. 1B is a schematic plan view of the elastic wave device in FIG. 1A.

FIG. 1A is a partial front sectional view of a principal portion of an elastic wave device according to a first preferred embodiment of the present invention. FIG. 1B is a schematic plan view of the elastic wave device in FIG. 1A. An elastic wave device 1 includes a support substrate 2. An acoustic reflective layer 3 is disposed on the support substrate 2. The acoustic reflective layer 3 includes multiple low acoustic impedance layers 3a, 3c, and 3e and multiple high acoustic impedance layers 3b and 3d. The acoustic impedance of the low acoustic impedance layers 3a, 3c, and 3e is relatively lower than the acoustic impedance of the high acoustic impedance layers 3b and 3d.

The materials of the low acoustic impedance layers 3a, 3c, and 3e and the high acoustic impedance layers 3b and 3d are not particularly limiting as long as the acoustic impedance relationship described above is satisfied. For example, a dielectric material or an insulative ceramic material, such as silicon oxide or silicon oxynitride, a synthetic resin, a metal or other suitable material may preferably be used as the material of the low acoustic impedance layers. As the material of the high acoustic impedance layers 3b and 3d, a dielectric material or a ceramic material, such as, for example, silicon oxide, silicon oxynitride, or aluminum nitride, a semiconductor material, a metal, or other suitable material may preferably be used.

A piezoelectric body 4 is disposed on the acoustic reflective layer 3. The piezoelectric body 4 is preferably made of, for example, LiNbO$_3$. The piezoelectric body 4 includes a first principal surface 4a and a second principal surface 4b which face each other. The acoustic reflective layer 3 is laminated on the second principal surface 4b of the piezoelectric body 4. An interdigital transducer (IDT) electrode 5 is disposed on the first principal surface 4a. The IDT electrode 5 includes multiple electrode fingers 6 and 7 which are interdigitated. In FIG. 1A, only an enlarged portion in which the electrode finger 6 and the electrode finger 7 are disposed is illustrated.

As illustrated in FIG. 1B, reflectors 8 and 9 are disposed on both sides of the IDT electrode 5 in the elastic-wave propagation direction. Thus, the elastic wave device 1 defines a one-port elastic wave resonator.

The elastic wave device 1 uses S0-mode plate waves propagating in the piezoelectric body 4.

A plate wave collectively indicates various waves excited in a piezoelectric body whose film thickness normalized by the wavelength $\lambda_x$ is equal to or less than about $1\lambda_x$, where $\lambda_x$ represents the wavelength in the direction in which the excited elastic waves propagate. To use plate waves, the energy of plate waves concentrates in the piezoelectric body 4. The acoustic reflective layer 3 in the elastic wave device 1 causes plate waves to be confined in the piezoelectric body 4, and the plate waves are used to obtain the characteristics.

Figure 2:
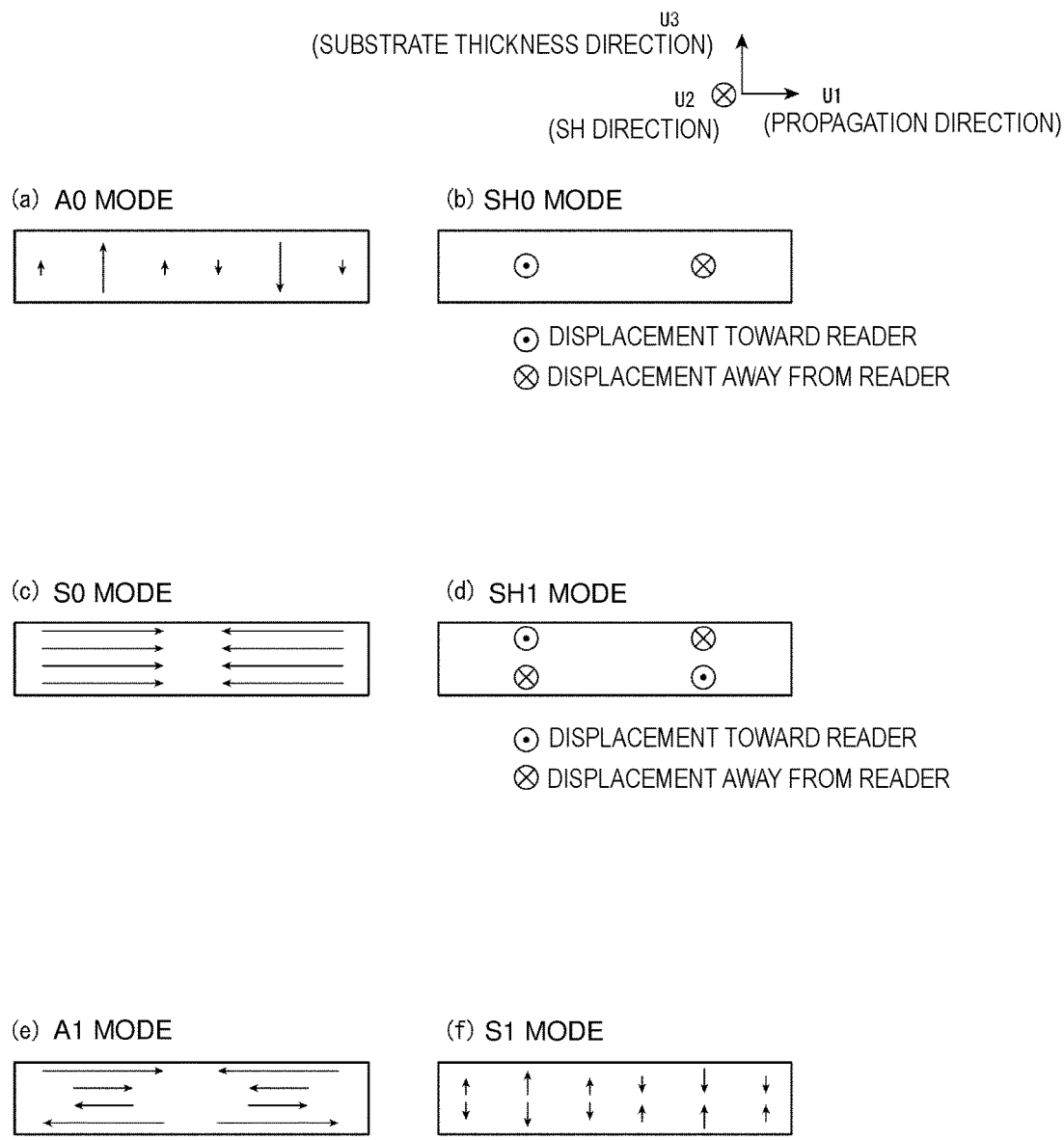
FIG. 2 is a schematic view for describing the displacement directions of the A0 mode, the SH0 mode, the S0 mode, the SH1 mode, the A1 mode, and the S1 mode of plate waves.

Referring to FIG. 2, the modes of plate waves will be described. FIG. 2 includes schematic views obtained when the piezoelectric body 4 is viewed from the front. Arrows indicate displacement directions. The U1 direction, the U2 direction, and the U3 direction illustrated in the upper right portion in FIG. 2 indicate coordinates. For the U1 direction and the U3 direction, the directions of the arrows indicate the positive direction. For the U2 direction, the direction from the front to the back of the plane of the drawing indicates the positive direction. The U1 direction indicates the direction in which plate waves propagate. The U2 direction is a direction which is parallel or substantially parallel to the first and second principal surfaces 4a and 4b of the piezoelectric body 4 and which is perpendicular or substantially perpendicular to the direction in which plate waves propagate. That is, the U2 direction indicates the SH direction. The U3 direction indicates the thickness direction of the piezoelectric body 4.

As illustrated in FIG. 2, in the A0 mode and the S1 mode, the main component of displacement is in the U3 direction. In the S0 mode and the A1 mode, the main component of displacement is in the U1 direction. In the SH0 mode and the SH1 mode, the main component of displacement is in the U2 direction component. The U1 direction component and the U3 direction component of displacement propagate while being combined with each other. Therefore, in the A0 mode and the S1 mode, not only the U3 direction component but also the U1 direction component is included. In the S0 mode and the A1 mode, not only the U1 direction component but also the U3 direction component is included, and the U2 direction component is small. The U2 direction component is not combined with the displacement components in the other directions. Therefore, in the SH0 mode and the SH1 mode, just a small amount of U1 direction component and U3 direction component are present.

The elastic wave device 1 uses the S0 mode illustrated in FIG. 2, among the above-described modes of plate waves. In the S0 mode of plate waves, the main component of displacement in the piezoelectric body 4 is directed in the direction parallel or substantially parallel to the elastic-wave propagation direction, and does not include nodes in the thickness direction of the piezoelectric body 4. In the elastic wave device 1, $LiNbO_3$, for example, is preferably used for the piezoelectric body 4. Therefore, the S0 mode of plate waves is excited at an acoustic velocity of about 6000 m/s to about 7000 m/s, for example. The acoustic velocity is expressed as the product of the frequency, at which elastic waves are excited, and the wavelength of the elastic waves. The frequency at which elastic waves are excited indicates the operating frequency of the elastic wave device. The wavelength of elastic waves indicates a length defined by the period of the IDT electrode 5 provided on the surface of the piezoelectric body 4 in the elastic wave device. When the period of electrode fingers changes in a single IDT electrode, the average of the periods in the IDT electrode is used as the wavelength of elastic waves excited by the IDT. If the piezoelectric body 4 used in the elastic wave device 1 is made of $LiNbO_3$ and if the product, which is obtained as described above, of the frequency, at which the elastic waves are excited, and the wavelength of the elastic waves is within about 6000 m/s to about 7000 m/s, for example, the elastic wave device 1 is recognized as using the S0 mode of plate waves.

In the acoustic reflective layer 3 of the elastic wave device 1, the low acoustic impedance layers 3a, 3c, and 3e alternating with the high acoustic impedance layers 3b and 3d are all laminated in the thickness direction. Therefore, there are four portions in which the low acoustic impedance layer 3a, 3c, or 3e is adjacent to the high acoustic impedance layer 3b or 3d in the laminating direction.

In the present preferred embodiment, the number of laminated layers including the low acoustic impedance layers and the high acoustic impedance layers is not particularly limiting. As long as there is at least one portion in which a low acoustic impedance layer is adjacent to a high acoustic impedance layer in the laminating direction, any configuration may be used. Therefore, the acoustic reflective layer may have a configuration in which a single low acoustic impedance layer is laminated on a single high acoustic impedance layer.

In the first preferred embodiment, preferably, for example, T1+T2 is within a range between about 0.40 and about 0.60 inclusive, and T1/(T1+T2) is within a range between about 0.35 and about 0.65 inclusive, where T1 is the thickness of each of the low acoustic impedance layers 3a, 3c, and 3e, and T2 is the thickness of each of the high acoustic impedance layers 3b and 3d. Since the elastic wave device 1 defines a resonator, a spurious response is difficult to appear near the resonant frequency or the anti-resonant frequency, and the loss is lowered. This will be described below based on specific experimental examples.

The thickness T1 indicates the thickness of each of the low acoustic impedance layers 3a, 3c, and 3e which is normalized by the thickness-direction component of the wavelength of traverse bulk waves propagating in the low acoustic impedance layers 3a, 3c, and 3e at the operating frequency of the elastic wave device 1. The thickness T2 indicates the thickness of each of the high acoustic impedance layers 3b and 3d which is normalized by the thickness-direction component of the wavelength of traverse bulk waves propagating in the high acoustic impedance layers 3b and 3d at the operating frequency of the elastic wave device 1. Since the elastic wave device 1 defines an elastic wave resonator, the resonant frequency is used as the operating frequency of the elastic wave device 1. Instead of the resonant frequency, the anti-resonant frequency may be used as the operating frequency.

First Experimental Example

The elastic wave device 1 is fabricated according to the following design parameters.

The piezoelectric body 4: $LiNbO_3$
The Euler angles for $LiNbO_3$: substantially (90°, 90°, 40°)
The wavelength determined by the electrode finger pitch of the IDT electrode 5=about 2.0 µm
The IDT electrode 5 is made of Al, and its film thickness is about 100 nm.
The duty ratio: about 0.50
The thickness of the piezoelectric body 4 made of $LiNbO_3$: about 400 nm
The low acoustic impedance layers 3a, 3c, and 3e: made of $SiO_2$, and each layer has a film thickness of about 403.5 nm.

The high acoustic impedance layers 3b and 3d: made of Pt, and each layer has a film thickness of about 145.7 nm.

The number of the laminated layers of the acoustic reflective layer 3 is five, which is the total number of the low acoustic impedance layers 3a, 3c, and 3e and the high acoustic impedance layers 3b and 3d.

The material of the support substrate 2: Si

Figure 3:
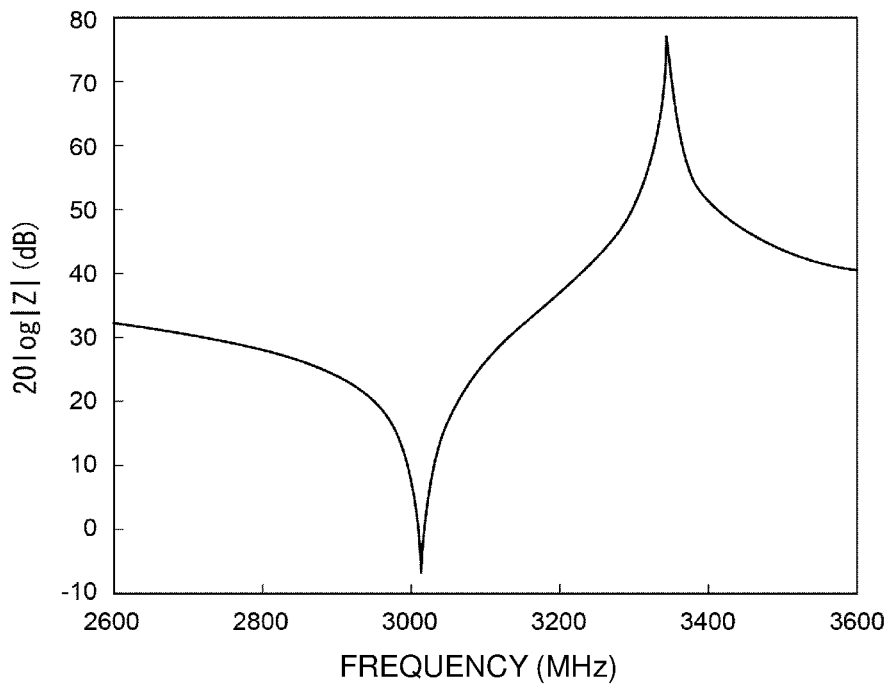
FIG. 3 is a diagram illustrating the impedance characteristics of an elastic wave device of a first experimental example of a preferred embodiment of the present invention.
Figure 4:
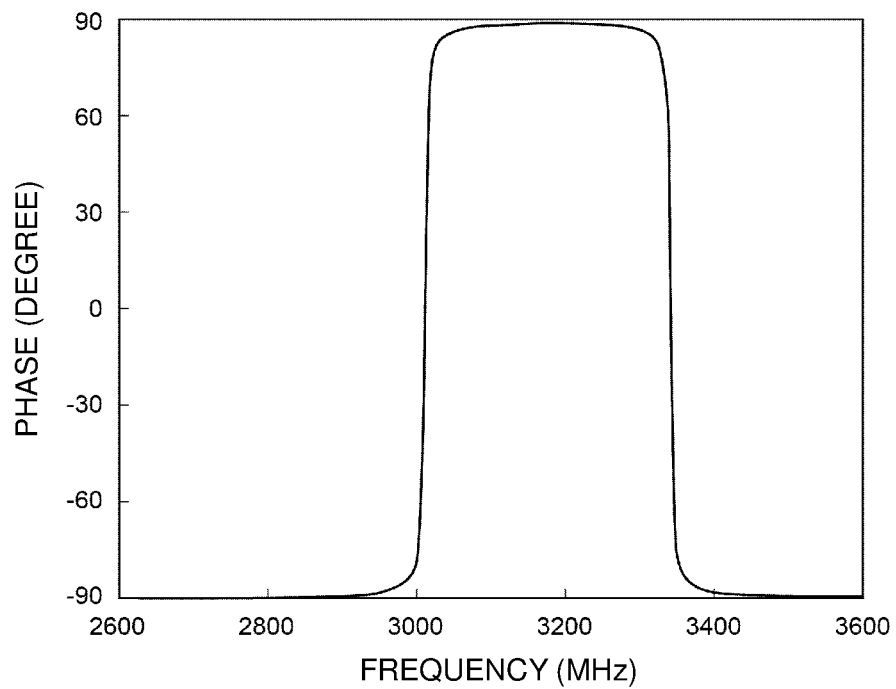
FIG. 4 is a diagram illustrating the phase characteristics of an elastic wave device of the first experimental example.

FIG. 3 illustrates the impedance characteristics of the elastic wave resonator having the design parameter described above. FIG. 4 illustrates the phase characteristics. As illustrated in FIG. 3, sharp peaks occur at the resonant frequency and the anti-resonant frequency, and good impedance characteristics are obtained. As is clear from FIGS. 3 and 4, a spurious response does not appear near the resonant frequency or the anti-resonant frequency. In the first experimental example, T1=about 0.25, and T2=about 0.25. This produces good characteristics. The reason of this will be described below.

Figure 5:
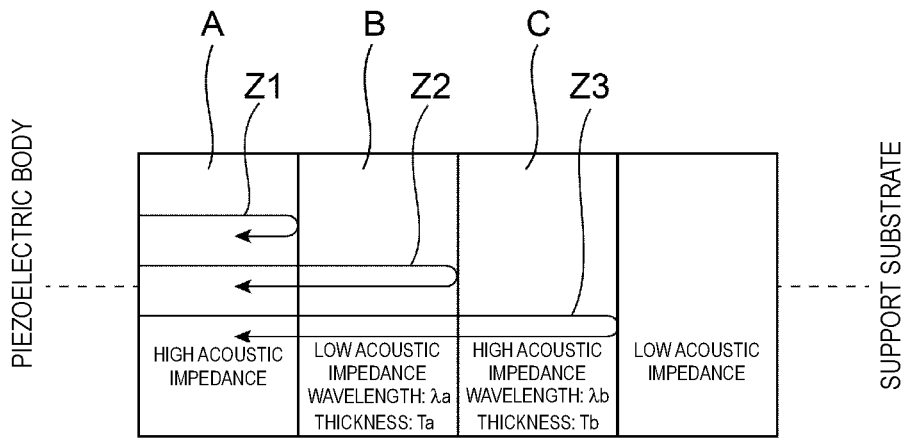
FIG. 5 is a schematic view for describing the mechanism of reflection of elastic waves in an elastic wave device of the first experimental example.

FIG. 5 is a schematic view for describing the mechanism of reflection of elastic waves, that is, plate waves, in the acoustic reflective layer 3. FIG. 5 illustrates a principal portion of the elastic wave device 1 such that the direction from the acoustic reflective layer toward the piezoelectric body corresponds to the horizontal direction. As illustrated in FIG. 5, elastic waves propagating from the piezoelectric body to the acoustic reflective layer are first reflected at the boundary surface between the high acoustic impedance layer A and the low acoustic impedance layer B. Elastic waves having passed through the boundary surface are reflected from the boundary surface between the low acoustic impedance layer B and the high acoustic impedance layer C. Elastic waves having passed through the boundary surface between the low acoustic impedance layer B and the high acoustic impedance layer C are reflected from the boundary surface between the high acoustic impedance layer C and the next low acoustic impedance layer. These reflex paths are referred to as path Z1, path Z2, and path Z3 as illustrated in FIG. 5. In this case, in path Z1, path Z2, and path Z3, if the phases of the elastic waves having been reflected match one another, the reflected elastic waves strengthen each other.

The wavelength of elastic waves propagating in the low acoustic impedance layer B is represented by $\lambda a$. The wavelength of elastic waves propagating in the high acoustic impedance layer C is represented by $\lambda b$. The thickness of the low acoustic impedance layer B is represented by Ta. The thickness of the high acoustic impedance layer C is represented by Tb.

It has been discovered that the optimal condition for causing the elastic waves reflected through paths Z1 and Z3 to strengthen each other, causing the elastic waves reflected through paths Z1 and Z2 to strengthen each other, and causing the elastic waves reflected through paths Z2 and Z3 to strengthen each other is as follows: firstly, the thickness $Ta/\lambda a$ of the low acoustic impedance layer, which is normalized by the wavelength $\lambda$ of elastic waves, is equal to about 0.25; secondly, the thickness $Tb/\lambda b$ of the high acoustic impedance layer, which is normalized by the wavelength $\lambda$ of elastic waves, is equal to about 0.25, for example.

The wavelength $\lambda$ of elastic waves propagating in a low acoustic impedance layer or a high acoustic impedance layer is represented by f/v, where f represents the frequency and v represents the phase velocity of elastic waves propagating in the corresponding layer. Therefore, the wavelength $\lambda$ of propagating elastic waves depends on the frequency. Accordingly, the reflectivity changes in accordance with the frequency. That is, the condition described above indicates the condition which produces the maximum reflectivity at a certain frequency. The reflectivity of the acoustic reflective layer 3 has frequency dependence. As described in U.S. Patent Application No. 2004/0140869, the reflectivity is high in a certain frequency range determined by a certain center frequency located at the midpoint of the range. At that time, in the case in which the total of the wavelength-normalized thickness of the low acoustic impedance layer and that of the high acoustic impedance layer corresponds to the center frequency, and in which the wavelength-normalized thickness of the low acoustic impedance layer is equal to that of the high acoustic impedance layer, the reflectivity at the center frequency is high.

In the structure in which the piezoelectric body 4 and the IDT electrode 5 are disposed on the acoustic reflective layer 3, elastic waves excited by the IDT electrode 5 and propagating as bulk waves in the thickness direction of the piezoelectric body 4 are reflected by the acoustic reflective layer 3. Thus, the elastic waves are confined in the piezoelectric body 4. The propagation direction in which elastic waves propagate as bulk waves in the thickness direction of the piezoelectric body 4 is expressed by using the wavenumber vector determined by the acoustic velocity and the frequency of the bulk waves. The elastic waves are excited by the IDT electrode 5. Therefore, the bulk waves described above have the wavenumber component parallel or substantially parallel to the first and second principal surfaces 4a and 4b of the piezoelectric body 4. The magnitude of the wavenumber component is determined by the wavelength determined by the electrode finger pitch of the IDT electrode 5.

Figure 6:
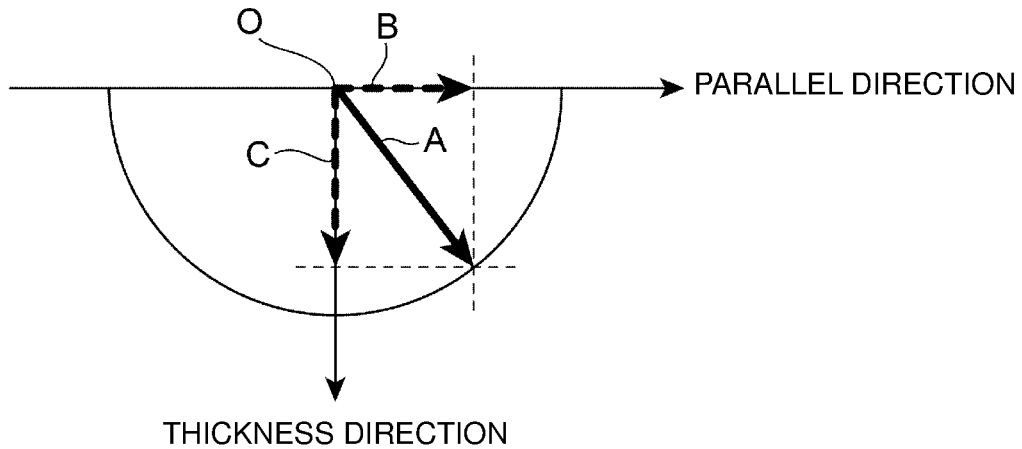
FIG. 6 is a schematic view for describing the relationship between an elastic-wave component in the thickness direction, an elastic-wave component in the direction parallel to the principal surface, and the elastic-wave propagation direction.

FIG. 6 is a diagram illustrating the relationship between the thickness-direction component C of elastic waves, the component B in the direction parallel or substantially parallel to the first and second principal surfaces 4a and 4b of the piezoelectric body 4, and the elastic-wave propagation direction A. The circle in FIG. 6 indicates the magnitude of the wavenumber of elastic waves propagating in a medium. Arrow B indicates the component propagating in the direction parallel or substantially parallel to the first and second principal surfaces 4a and 4b of the piezoelectric body 4, and, as described above, its magnitude is determined by the wavelength $\lambda$ determined by the electrode finger pitch of the IDT electrode 5. The direction from starting point O toward the point, at which the line extending from the leading end of arrow B in the downward direction in the plane of the drawing intersects the circle in the drawing, represents the elastic-wave propagation direction A. The direction from starting point O toward the point, at which the line extending from the intersection in the left direction in the plane of the drawing intersects the axis in the thickness direction, is the direction indicated by arrow C. The length of arrow C indicates the wavenumber component propagating in the thickness direction of the piezoelectric body 4. Therefore, as illustrated in FIG. 6, in bulk waves, the wavenumber component in the thickness direction of the piezoelectric body 4 may be determined, and the piezoelectric-body thickness-direction component of the wavelength may be determined from the wavenumber component.

The wavelength in the elastic-wave propagation direction which is determined by the electrode finger pitch of the IDT electrode 5 is represented by $\lambda_x$; the frequency is represented by f; the propagation velocity of bulk waves propagating in the medium is represented by v; the piezoelectric-body 4 thickness-direction component of the wavelength of bulk waves propagating in the medium is represented by $\lambda_z$. In the case in which the medium is an isotropic body, $\lambda_z$ is expressed by using Expression (1) described below.

$$\lambda_z = \left( \sqrt{\frac{f^2}{v^2} - \frac{1}{\lambda_x^2}} \right)^{-1} \quad (1)$$

In the structure in which elastic waves are confined in the piezoelectric body 4 by using the acoustic reflective layer 3, the thickness of each medium may be set based on the thickness-direction component $\lambda_z$, which is obtained as described above, of transversal waves propagating in the medium.

As bulk waves, longitudinal waves and transversal waves are present and propagate at the respective different phase velocities. Therefore, there are two thickness-direction components of wavelength which correspond to longitudinal waves and transversal waves.

In the elastic wave device 1, between longitudinal waves and transversal waves, the thicknesses of the media, that is, the thicknesses of the low acoustic impedance layers 3a, 3c, and 3e and the high acoustic impedance layers 3b and 3d were normalized based on the thickness-direction component of the wavelength of transversal waves. The reason for this is as follows.

Transversal waves may be decomposed into shear horizontal (SH) waves and shear vertical (SV) waves. SH waves have the displacement component parallel or substantially parallel to the first and second principal surfaces 4a and 4b of the piezoelectric body 4. SV waves have the displacement component vertical or substantially vertical to SH waves. In a single medium, the three components of longitudinal waves, SV waves, and SH waves propagate independently of each other. SH waves which enter the boundary surface between media are reflected or transmitted as SH waves. In contrast, longitudinal waves and SV waves which enter the boundary surface between media are reflected or transmitted while mode conversion into each other occurs. At that time, if the thickness of each medium is set based on the wavelength of the thickness-direction component of transversal waves, the transversal wave components, that is, SV waves and SH waves, have the phase relationship in which, when propagating in the direction toward the support substrate 2, the transversal wave components weaken each other, and in which, when propagating in the direction toward the first and second principal surfaces 4a and 4b of the piezoelectric body 4, the transversal wave components strengthen each other. Therefore, leakage in the direction toward the support substrate 2 is able to be reduced or prevented.

In contrast, the longitudinal wave component does not have the phase relationship as described above, but mode conversion between longitudinal waves and SV waves occurs at the boundary between media. Components obtained through mode conversion into SV waves have the phase relationship. Therefore, the components have the relationship in which, when propagating in the direction toward the support substrate 2, the components weaken each other, and in which, when propagating in the direction toward the piezoelectric body 4, the components strengthen each other. Therefore, through repeated mode conversions occurring when bulk waves are reflected or transmitted at boundaries, the bulk waves emitted as longitudinal waves from the IDT electrode 5 ultimately propagate in the direction toward the IDT electrode 5.

The elastic wave device 1 uses the S0 mode of plate waves. In the S0 mode, the U1 component is maximum, the U3 component is present, and the U2 component is small. That is, just a small amount of SH wave component is present, and the longitudinal wave component and the SV wave component are main components. Therefore, the elastic waves are repeatedly reflected and transmitted at the boundary surfaces of the layers in the acoustic reflective layer 3 while the mode conversion occurs. Finally, the elastic waves concentrate near the IDT electrode 5, and are confined in the piezoelectric body 4.

For example, in plate waves in the SH0 mode, the U2 direction component is the main component. Therefore, since the SH wave is the main component, the mode conversion at the boundary surfaces of the layers in the acoustic reflective layer 3 does not occur.

The materials of the low acoustic impedance layers 3a, 3c, and 3e and the high acoustic impedance layers 3b and 3d used in the acoustic reflective layer 3 are not particularly limiting as long as the materials satisfy the acoustic impedance relationship described above. The density of each typical material, the acoustic velocity and the acoustic impedance of a longitudinal wave, the acoustic velocity and the acoustic impedance of a transversal wave are described in Table 1 described below.

TABLE 1

| Material | Density [kg/m³] | Longitudinal wave | | Transversal wave | |
|---|---|---|---|---|---|
| | | Acoustic velocity [m/s] | Acoustic impedance [×10⁶ kg/m²/s] | Acoustic velocity [m/s] | Acoustic impedance [×10⁶ kg/m²/s] |
| SiO$_2$ | 2200 | 5976 | 13.15 | 3768 | 8.29 |
| AlN | 3260 | 10335 | 33.69 | 6016 | 19.61 |
| SiN | 3200 | 10763 | 34.44 | 5942 | 19.01 |
| Al$_2$O$_3$ | 3800 | 10480 | 39.82 | 6198 | 23.55 |
| Ta$_2$O$_5$ | 8470 | 4546 | 38.50 | 2430 | 20.58 |
| SiC | 3200 | 11962 | 38.28 | 7181 | 22.98 |
| W | 19263 | 5220 | 100.56 | 2886 | 55.60 |
| Pt | 21450 | 3953 | 84.79 | 1678 | 35.99 |
| Au | 19300 | 3378 | 65.20 | 1245 | 24.03 |
| Ta | 16678 | 4709 | 78.54 | 2220 | 37.03 |

A combination of materials, which are illustrated in Table 1 and between which differences in acoustic impedance are large, is selected. In accordance with the values of their transversal wave acoustic velocities, the thickness of each layer is set based on the piezoelectric-body 4 thickness-direction component, which is obtained using Expression described above, of wavelength. Thus, elastic waves are effectively confined in the piezoelectric body 4.

The consideration described above was made in the first experimental example. Accordingly, the thicknesses of the low acoustic impedance layers 3a, 3c, and 3e and the high acoustic impedance layers 3b and 3d in the acoustic reflective layer 3 were set. That is, the acoustic velocity of a traverse bulk wave propagating in SiO$_2$, which is the material of the low acoustic impedance layers 3a, 3c, and 3e, is about 3768 m/sec. The acoustic velocity of a traverse bulk wave propagating in Pt, which is the material of the high acoustic impedance layers 3b and 3d, is about 1678 m/sec. The frequency f in Expression (1) is set to about 3000 MHz. The wavelength determined by the electrode finger pitch of the IDT electrode 5 is about 2.0 μm. Therefore, the piezoelectric-body 4 thickness-direction components of the wavelength of traverse bulk waves propagating in SiO₂ and Pt are as follows.

$$\lambda zt = \{((3000 \text{ MHz})/(3768 \text{ m/s}))^2 - (1/(2.0 \text{ μm}))^2\}^{(-1/2)} = 1.6141 \text{ μm} \quad \text{SiO}_2:$$

$$\lambda zt = \{((3000 \text{ MHz})/(1678 \text{ m/s}))^2 - (1/(2.0 \text{ μm}))^2\}^{(-1/2)} = 0.5828 \text{ μm} \quad \text{Pt}:$$

In the elastic wave device 1 of the first experimental example, the piezoelectric-body 4 thickness-direction components, which are obtained as described above, of wavelength are multiplied by 0.25. Thus, the thicknesses of the low acoustic impedance layers 3a, 3c, and 3e and the high acoustic impedance layers 3b and 3d were set.

Second Experimental Example

The elastic wave device 1 was fabricated similarly to the first experimental example except that the thicknesses of the low acoustic impedance layers 3a, 3c, and 3e and the high acoustic impedance layers 3b and 3d in the acoustic reflective layer 3 are changed. Then, the impedance characteristics of the elastic wave device 1 were evaluated. The normalized thicknesses T1 and T2, which are obtained by normalizing the thicknesses of the low acoustic impedance layers 3a, 3c, and 3e and the high acoustic impedance layers 3b and 3d using the transversal-wave wavelength in the thickness direction of the piezoelectric body 4, were equal or substantially equal to each other. The normalized thicknesses T1 and T2 were changed in a range between about 0.150 and about 0.350 inclusive as illustrated in No. 1 to No. 5 in Table 2 described below. Since the resonant frequency is about 3000 MHz, in Expression (1), the frequency f was set to about 3000 MHz in calculation of the transversal-wave wavelength in the thickness direction of the piezoelectric body 4.

TABLE 2

| No. | The total of the normalized thicknesses of a low acoustic impedance layer and a high acoustic impedance layer T1 + T2 | The thickness of a low acoustic impedance layer (SiO₂) | | The thickness of a high acoustic impedance layer (Pt) | |
|---|---|---|---|---|---|
| | | Normalized thickness: T1 | Thickness [nm] | Normalized thickness: T2 | Thickness [nm] |
| 1 | 0.350 | 0.175 | 282.5 | 0.175 | 102.0 |
| 2 | 0.400 | 0.200 | 322.8 | 0.200 | 116.6 |
| 3 | 0.500 | 0.250 | 403.5 | 0.250 | 145.7 |
| 4 | 0.600 | 0.300 | 484.2 | 0.300 | 174.8 |
| 5 | 0.650 | 0.325 | 524.6 | 0.325 | 189.4 |

FIGS. 7 to 10 illustrate the impedance characteristics of elastic wave devices fabricated according to No. 1, No. 2, No. 4 and No. 5 in Table 2.

Figure 7:
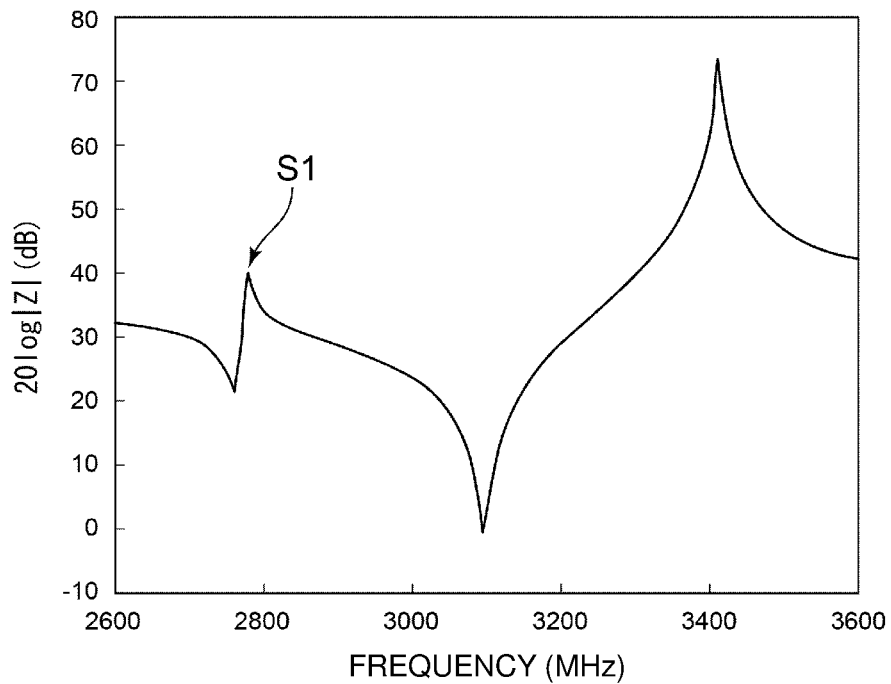
FIG. 7 is a diagram illustrating the impedance characteristics of an elastic wave device of a second experimental example No. 1.

FIG. 7 illustrates the impedance characteristics of No. 1. As illustrated in FIG. 7, a large spurious response indicated by using arrow S1 appears on the low frequency side of the resonant frequency. In No. 1 in which the normalized thicknesses T1 and T2 are less than about 0.20, such a large spurious response on the low frequency side appears. This may be because the small thicknesses of the low acoustic impedance layers 3a, 3c, and 3e and the high acoustic impedance layers 3b and 3d in the acoustic reflective layer 3 lead to the state in which the reflectivity of the acoustic reflective layer 3 is high on the high frequency side and is low in the frequency band equal to or less than the resonant frequency.

Figure 8:
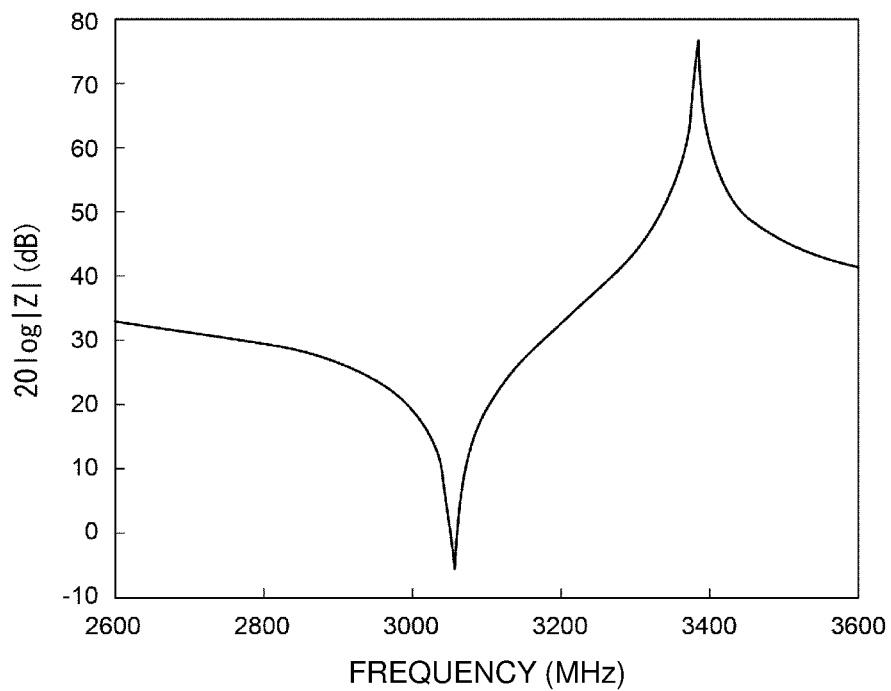
FIG. 8 is a diagram illustrating the impedance characteristics of an elastic wave device of a second experimental example No. 2.
Figure 9:
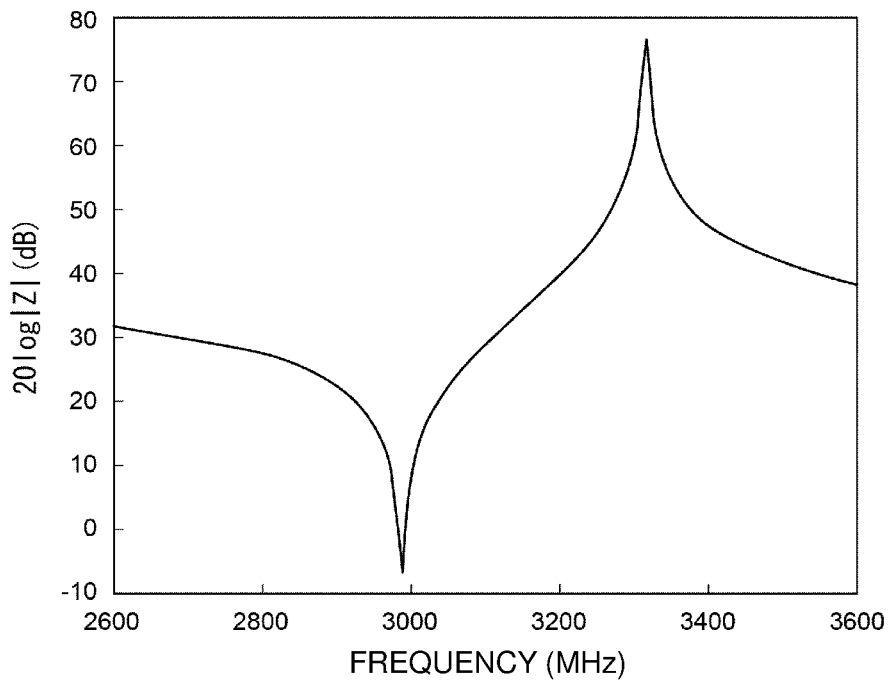
FIG. 9 is a diagram illustrating the impedance characteristics of an elastic wave device of a second experimental example No. 4.
Figure 10:
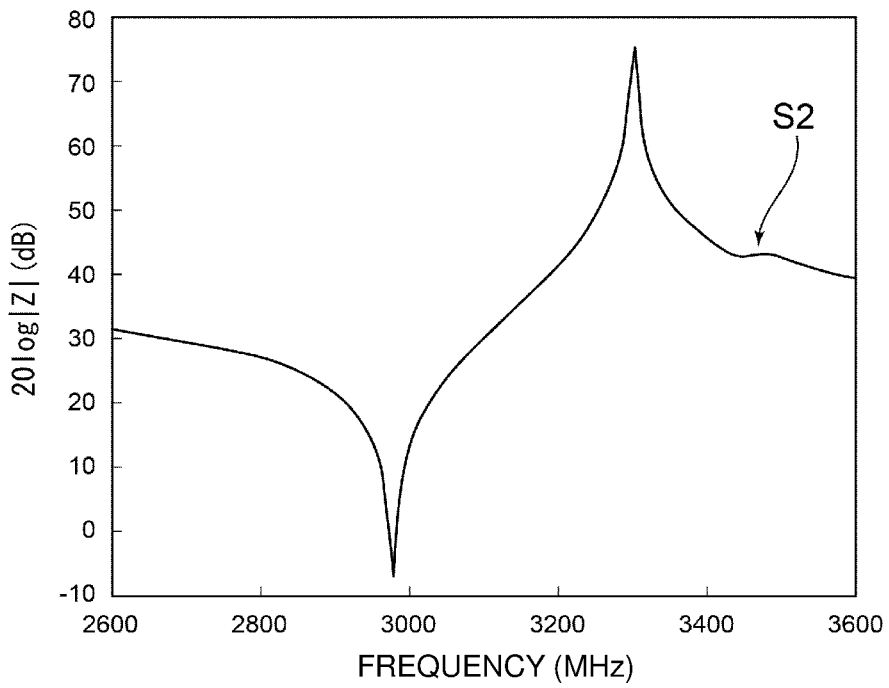
FIG. 10 is a diagram illustrating the impedance characteristics of an elastic wave device of a second experimental example No. 5.

In contrast, FIG. 8 illustrates the impedance characteristics of No. 2. FIG. 9 illustrates the impedance characteristics of No. 4. As illustrated in FIGS. 8 and 9, in the case in which the normalized thicknesses T1 and T2 are about 0.20 and about 0.30, for example, no spurious responses are present. FIG. 10 illustrates the impedance characteristics of No. 5. As illustrated in FIG. 10, in the case in which both of the normalized thicknesses T1 and T2 are about 0.325, a spurious response indicated by using arrow S2 appears on the high frequency side of the anti-resonant frequency. In addition, in the phase characteristics (not illustrated), a rise is recognized at the slightly higher frequency side than the anti-resonant frequency.

FIGS. 3 and 4 illustrate the characteristics under the condition No. 3 in Table 2. Therefore, under the conditions in No. 2 and No. 4 in Table 2, it was discovered that good characteristics with no spurious responses are obtained.

The total, T1+T2, of the normalized thicknesses of a low acoustic impedance layer and a high acoustic impedance layer, which are adjacent to each other, greatly influences the center frequency in the frequency band in which the reflectivity is high. That is, the smaller T1+T2 is, the higher the center frequency, at which the reflectivity is high, is. The larger T1+T2 is, the lower the center frequency, at which reflectivity is high, is.

In the case of the condition No. 1 in FIG. 7, since T1+T2 is small, the frequency band, in which the reflectivity is high, is located on the high frequency side. This causes the reflectivity on the low frequency side of the resonant frequency to be decreased, which likely causes a spurious response to appear. In contrast, in the case of the condition No. 5 in FIG. 10, since T1+T2 is large, the frequency band, in which the reflectivity is high, is located on the low frequency side. This causes the reflectivity on the high frequency side of the anti-resonant frequency to be decreased, which likely causes a spurious response to appear. That is, when the total of the normalized thickness T1 of the low acoustic impedance layers 3a, 3c, and 3e and the normalized thickness T2 of the high acoustic impedance layers 3b and 3d is within the range between about 0.40 and about 0.60 inclusive, for example, good characteristics with a small amount of spurious response are obtained.

In the first experimental example and the second experimental example, the thicknesses of the low acoustic impedance layers 3a, 3c, and 3e are equal or substantially equal to each other, and the thicknesses of the high acoustic impedance layers 3b and 3d are equal or substantially equal to each other. Alternatively, the thicknesses may be different from each other in the range described above.

The acoustic impedances of the low acoustic impedance layers 3a, 3c, and 3e are not necessarily the same. However, the acoustic impedances of the low acoustic impedance layers 3a, 3c, and 3e are preferably the same or substantially the same. In this case, the same material may be used to easily fabricate the low acoustic impedance layers 3a, 3c, and 3e. The acoustic impedances of the high acoustic impedance layers 3b and 3d may be different from each other. However, the acoustic impedances are preferably the same or substantially the same.

In the elastic wave device 1, the thickness of the piezoelectric body 4 is preferably about 0.2λ, for example. This is not limiting. In accordance with necessary characteristics, the thickness of the piezoelectric body 4 may be preferably set in the range equal to or less than about 1.0λ, for example.

The material of the IDT electrode 5 is not limited to Al, and may be one of various metals or an alloy. In addition, the IDT electrode 5 may have a structure in which multiple metal films are laminated. Alternatively, an adhesive layer and a conductive auxiliary layer may be laminated. The IDT electrode 5 may be provided directly on the piezoelectric body 4. Alternatively, the IDT electrode 5 may be provided indirectly, for example, on a dielectric film provided on the piezoelectric body 4. The thickness of each electrode layer in the IDT electrode 5 may be appropriately selected in accordance with necessary characteristics as long as the S0 mode of plate waves is used.

A Ti film or other suitable film may be provided as an adhesive layer at the interface between the acoustic reflective layer 3 and the piezoelectric body 4 or at the interfaces between the low acoustic impedance layers 3a, 3c, and 3e and the high acoustic impedance layers 3b and 3d in the acoustic reflective layer 3. That is, the piezoelectric body 4 may be laminated directly, or indirectly, on the acoustic reflective layer 3.

Third Experimental Example

Figure 11:
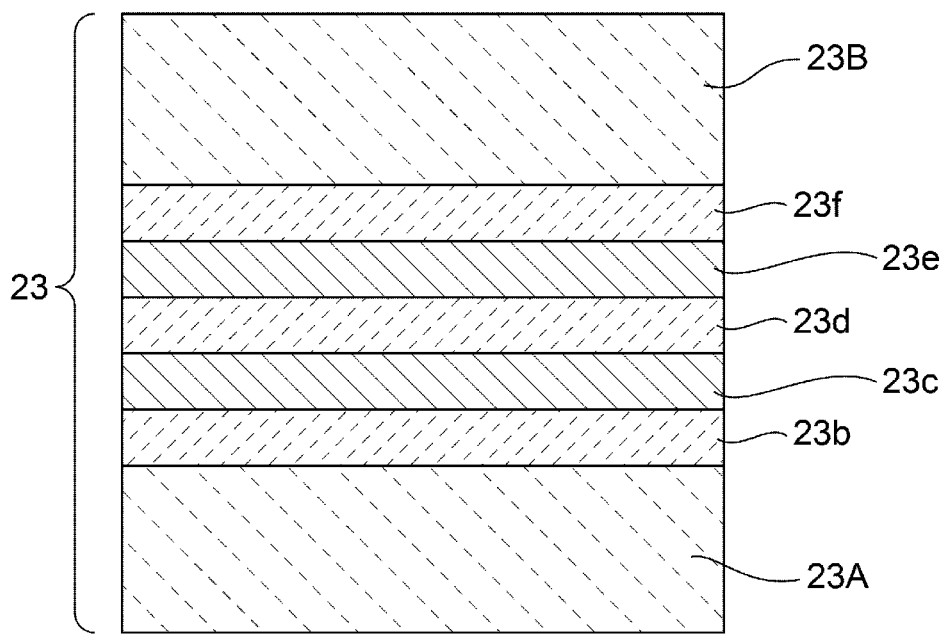
FIG. 11 is a front sectional view for describing an acoustic reflective layer of an elastic wave device of a third experimental example.

The third experimental example includes an acoustic reflective layer 23 illustrated in FIG. 11. As illustrated in FIG. 11, in the acoustic reflective layer 23, $SiO_2$ layers 23A and 23B having a semi-infinite thickness are disposed as the top and bottom layers. Three high acoustic impedance layers 23b, 23d, and 23f alternating with two low acoustic impedance layers 23c and 23e are laminated between the $SiO_2$ layer 23A and the $SiO_2$ layer 23B. Each of the low acoustic impedance layers 23c and 23e is preferably made of $SiO_2$, for example, and the thickness normalized by the substrate-thickness direction component, which is obtained by using Expression (1) described above, of the wavelength of elastic waves is represented by T1. Each of the high acoustic impedance layers 23b, 23d, and 23f is preferably made of Pt, for example, and the normalized thickness is represented by T2.

As illustrated in Table 3 described below, elastic wave devices of No. 11 to No. 19 are fabricated such that, firstly, the total of the normalized thickness T1 of each of the low acoustic impedance layers 23c and 23e and the normalized thickness T2 of each of the high acoustic impedance layers 23b, 23d, and 23f is preferably equal to about 0.50, and secondly, the thickness of each low acoustic impedance layer is different from that of each high acoustic impedance layer.

TABLE 3

| | | The thickness of a low acoustic impedance layer ($SiO_2$) | | The thickness of a high acoustic impedance layer (Pt) | |
|---|---|---|---|---|---|
| No. | T1/ (T1 + T2) | Normalized thickness: T1 | Thickness [nm] | Normalized thickness: T2 | Thickness [nm] |
| 11 | 0.30 | 0.150 | 242.1 | 0.350 | 204.0 |
| 12 | 0.35 | 0.175 | 282.5 | 0.325 | 189.4 |

TABLE 3-continued

| | | The thickness of a low acoustic impedance layer ($SiO_2$) | | The thickness of a high acoustic impedance layer (Pt) | |
|---|---|---|---|---|---|
| No. | T1/ (T1 + T2) | Normalized thickness: T1 | Thickness [nm] | Normalized thickness: T2 | Thickness [nm] |
| 13 | 0.40 | 0.200 | 322.8 | 0.300 | 174.8 |
| 14 | 0.45 | 0.225 | 363.2 | 0.275 | 160.3 |
| 15 | 0.50 | 0.250 | 403.5 | 0.250 | 145.7 |
| 16 | 0.55 | 0.275 | 443.9 | 0.225 | 131.1 |
| 17 | 0.60 | 0.300 | 484.2 | 0.200 | 116.6 |
| 18 | 0.65 | 0.325 | 524.6 | 0.175 | 102.0 |
| 19 | 0.70 | 0.350 | 564.9 | 0.150 | 87.4 |

In determining the normalized thicknesses T1 and T2, the wavelength, in the direction parallel or substantially parallel to the first and second principal surfaces 4a and 4b of the piezoelectric body 4, of elastic waves which is determined by the electrode finger pitch of the IDT electrode 5 is preferably set to about 2.0 μm. The reflectivity is defined as the ratio of the amplitude of elastic waves transmitted from the top $SiO_2$ layer having the semi-infinite thickness with respect to the amplitude of elastic waves having been reflected and propagating in the top $SiO_2$ layer. The frequency dependence of the reflectivity is determined.

Figure 12:
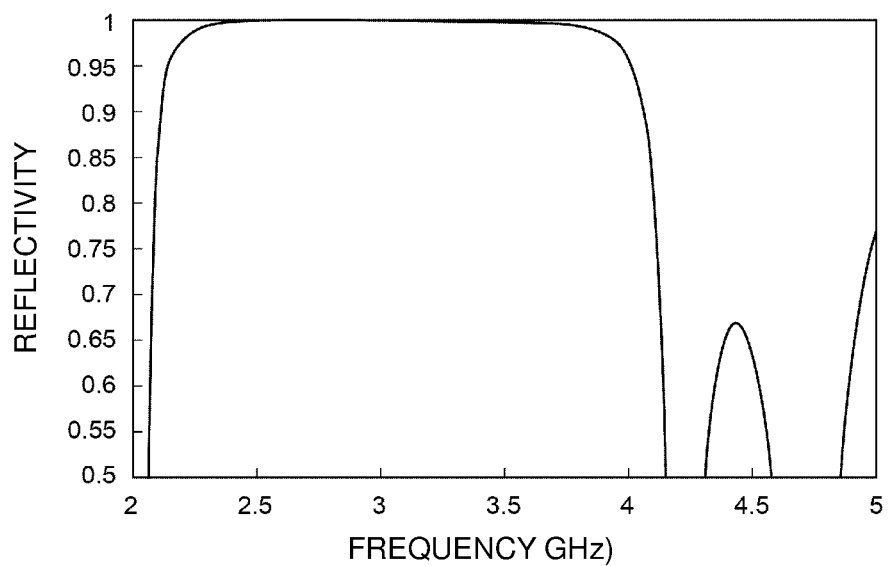
FIG. 12 is a diagram illustrating the frequency dependence of reflectivity in the case in which T1 and T2 are about 0.25 and T1/(T1+T2)=about 0.50, in the third experimental example.

FIG. 12 illustrates the frequency dependence of the reflectivity determined in the case in which T1 and T2 are equal to about 0.25 that is, T1/(T1+T2)=about 0.50 in Table 2 described above. The characteristics in FIG. 12 are obtained by changing the method described in U.S. Patent Application No. 2004/0140869 partially so that the method is applied to the structure described in preferred embodiments of the present invention. In the structure described in preferred embodiments of the present invention, the thickness-direction component of the wavenumber of elastic waves propagating in the acoustic reflective layer is expressed as $2\pi/\lambda_z$ by using $\lambda_z$ obtained in Expression (1). In U.S. Patent Application No. 2004/0140869, the wavenumber in the thickness direction is partially represented by, ω/vi, in Expression (2) in U.S. Patent Application No. 2004/0140869 which indicates the phase rotation in each layer of the acoustic reflective layer. Therefore, this portion is replaced by $2\pi/\lambda_z$, and the other portion in the method described in U.S. Patent Application No. 2004/0140869 is used. Thus, the characteristics in FIG. 12 are obtained. As the bulk-wave acoustic velocity v used in Expression (1), the value of traverse bulk waves is used. The wavelength $\lambda_x$ in the propagation direction is set to about 2.0 μm.

As is clear from FIG. 12, the reflectivity is maximum at about 3 GHz. It was discovered that, in a certain width of frequency range whose center is located at about 3 GHz, the reflectivity is about 1, and elastic waves are effectively confined in the piezoelectric body 4.

Figure 13:
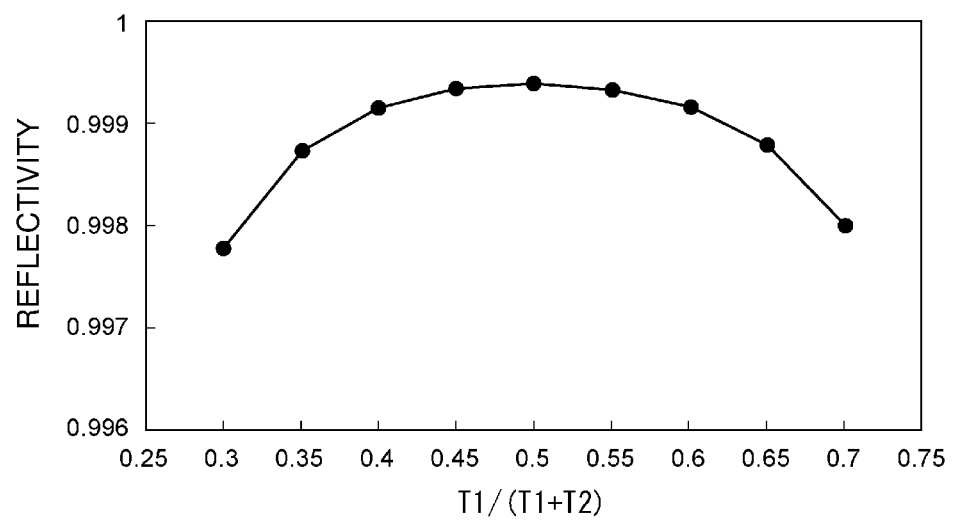
FIG. 13 is a diagram illustrating the relationship between T1/(T1+T2) and the maximum of reflectivity.
Figure 14:
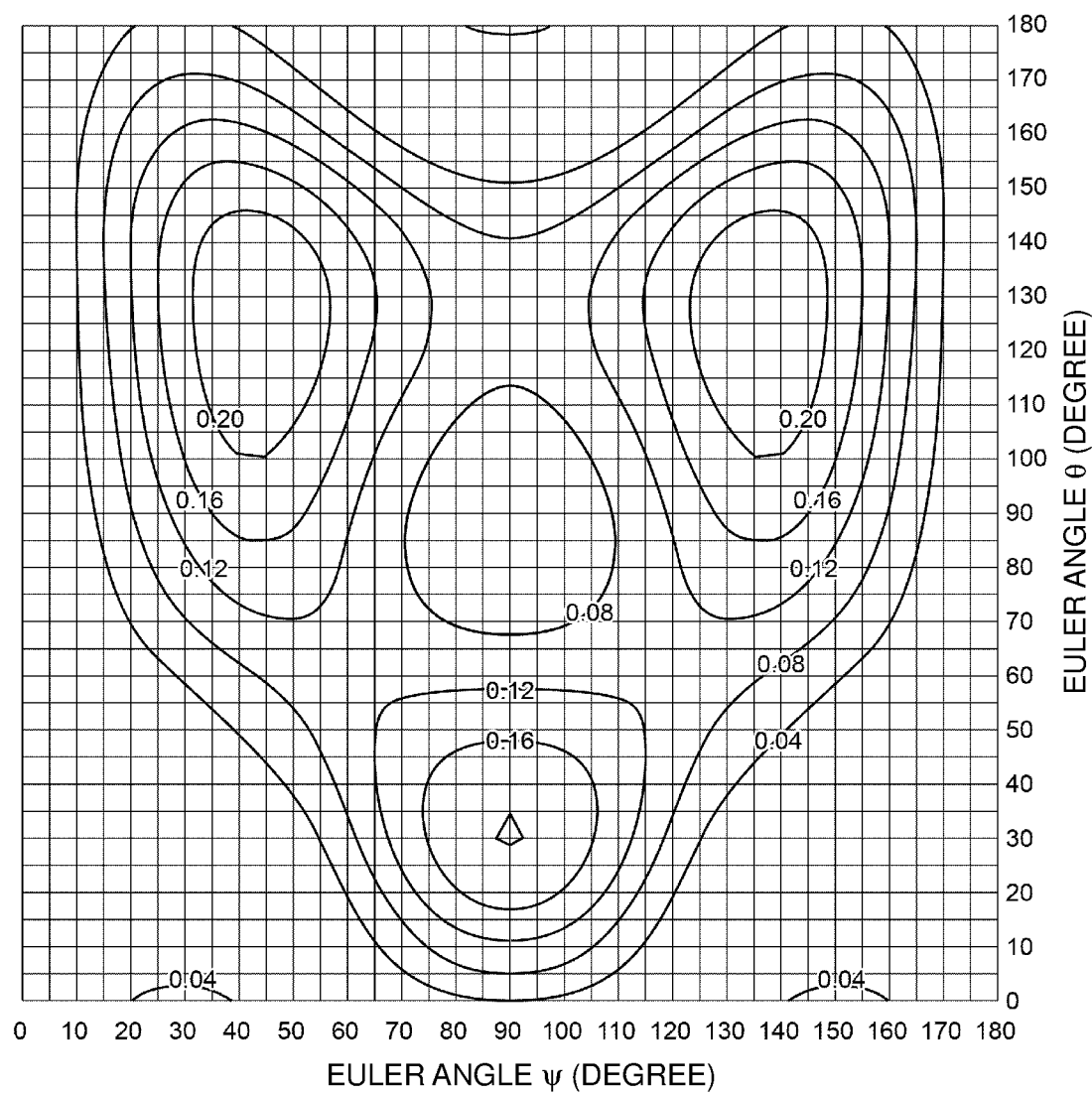
FIG. 14 is a diagram illustrating the relationship between Euler angles, θ and φ, and electromechanical coupling coefficient $k^2$ in the S0 mode, where Euler angles for LiNbO$_3$ are substantially (about 0°, θ, φ).
Figure 15:
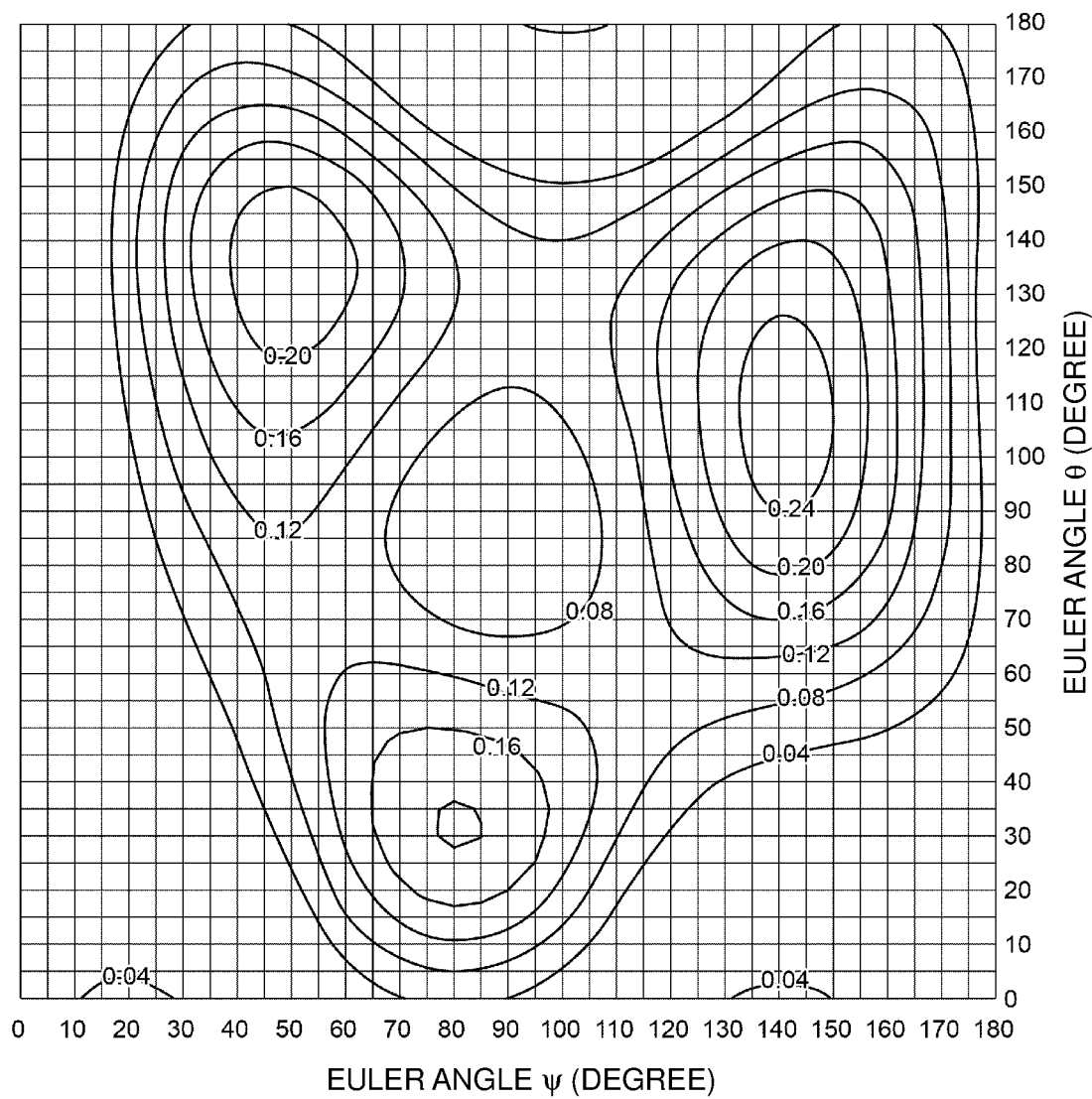
FIG. 15 is a diagram illustrating the relationship between Euler angles, θ and φ, and the electromechanical coupling coefficient $k^2$ in the S0 mode, where Euler angles for LiNbO$_3$ are substantially (about 10°, θ, φ).
Figure 16:
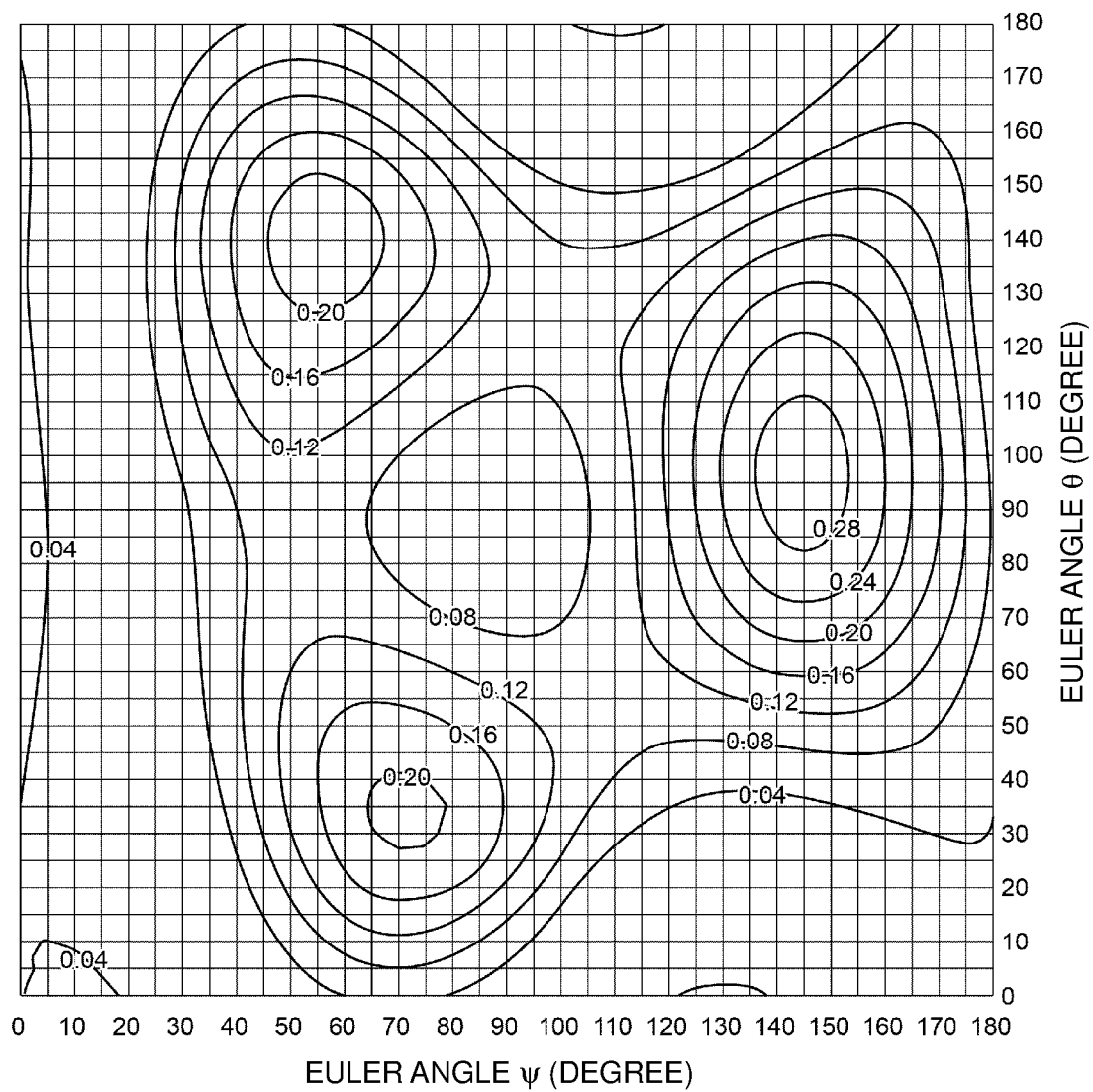
FIG. 16 is a diagram illustrating the relationship between Euler angles, θ and φ, and the electromechanical coupling coefficient $k^2$ in the S0 mode, where Euler angles for LiNbO$_3$ are substantially (about 20°, θ, φ).
Figure 17:
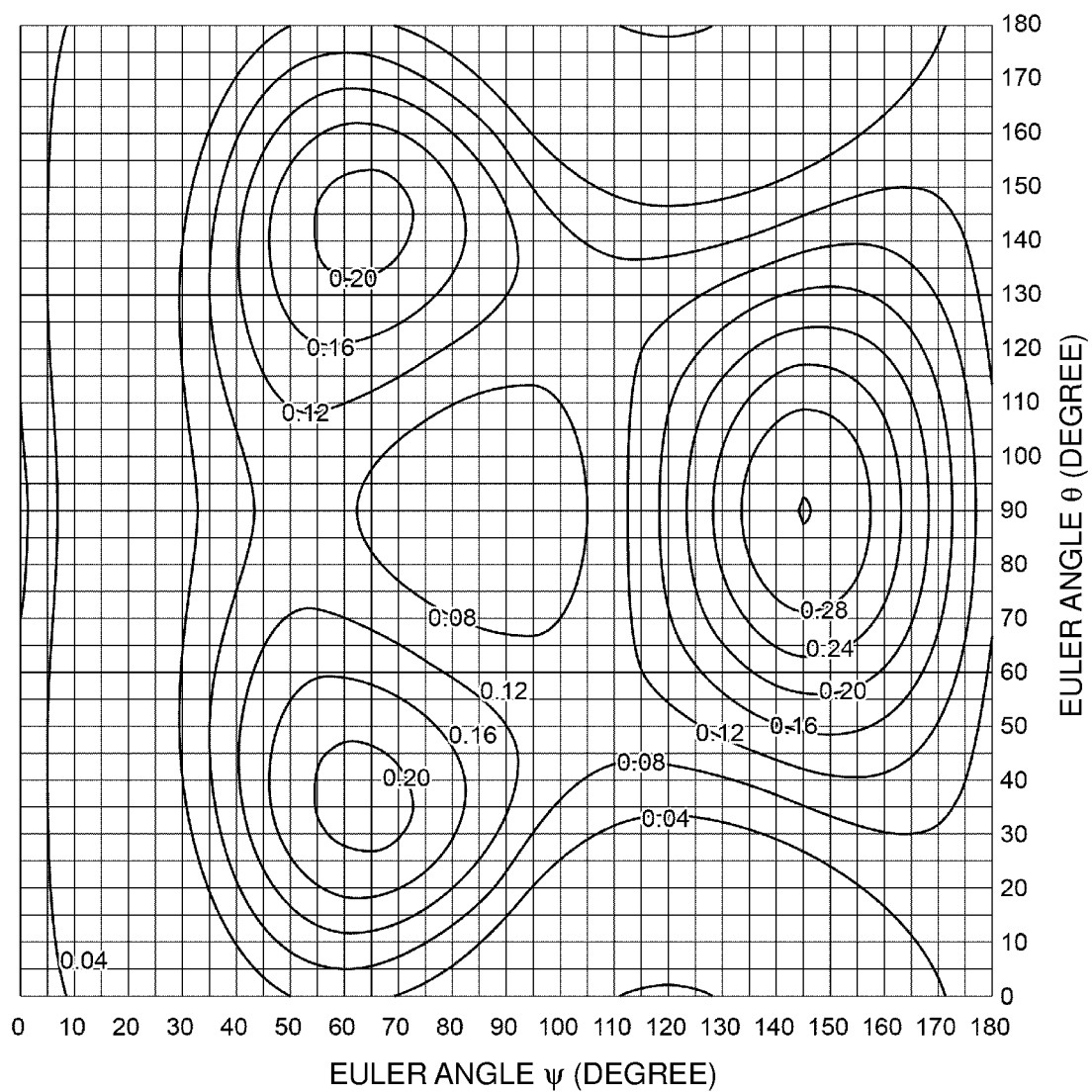
FIG. 17 is a diagram illustrating the relationship between Euler angles, θ and φ, and the electromechanical coupling coefficient $k^2$ in the S0 mode, where Euler angles for LiNbO$_3$ are substantially (about 30°, θ, φ).

It is probable that, in the characteristics described above, the higher the peak value of the reflectivity is, the smaller the loss in the elastic wave device 1 is. Accordingly, by using the elastic wave devices of No. 11 to No. 19 in Table 3, the frequency dependence of the reflectivity was determined, and the relationship between T1/(T1+T2) and the maximum reflectivity was determined. FIG. 13 illustrates this relationship. As is clear from FIG. 13, the maximum reflectivity is maximum at and near a point at which T1/(T1+T2) is about 0.50. This is because, in the case in which the normalized thicknesses of the low acoustic impedance layers 23c and 23e and the high acoustic impedance layers 23b, 23d, and 23f are about 0.25, that is, T1/(T1+T2)=about 0.50, the reflectivity is maximum. As T1/(T1+T2) deviates from about 0.50, the reflectivity decreases gradually, and the loss increases. It was discovered that, when T1/(T1+T2) is within the range between about 0.35 and about 0.65 inclusive, the reflectivity is sufficiently high, and the amount of elastic waves that leak to the support substrate 2 decreases, thus achieving a small amount of loss in the elastic wave device 1.

As described above, in the elastic wave device using the S0 mode of plate waves, if the total (T1+T2) of the normalized thicknesses of a low acoustic impedance layer and a high acoustic impedance layer, which are adjacent to each other, is between about 0.40 and about 0.60 inclusive, and if T1/(T1+T2) is between about 0.35 and about 0.65 inclusive, the amount of spurious response is small, thus achieving a small amount of loss.

The piezoelectric body 4 is not limited to LiNbO$_3$. As long as the piezoelectric body 4 is a piezoelectric body which is capable of exciting plate waves in the S0 mode, any material may be used. Therefore, AlN doped with LiTaO$_3$, AlN, ZnO, Sc, or other suitable materials may be used.

FIGS. 14 to 17 illustrate the change of the electromechanical coupling coefficient k$^2$ in the S0 mode which is obtained in the case in which LiNbO$_3$ is used and the Euler angles ($\phi$, $\theta$, $\varphi$) for LiNbO$_3$ are changed. In FIGS. 14 to 17, an area in which the electromechanical coupling coefficient k$^2$ is large is preferable. Particularly, an area in which k$^2$ is equal to or greater than about 0.04 is preferable because the area causes the S0 mode to be strongly excited. Preferably, the electromechanical coupling coefficient k$^2$ is equal to or greater than about 0.04 if the Euler angles are substantially within one of the following Euler angles: (within a range of about 0°±5°, about 0° to about 150°, within a range of about 90°±10°); (within a range of about 30°±5°, within a range of about 90°±10°, about 35° to about) 180°; (within a range of about 30°±5°, within a range of about 90°±10°, about 0° to about 5°). Thus, not only may the S0 mode be strongly excited, but also the other modes are difficult to be excited because of the good crystal symmetry property.

Similarly to LiNbO$_3$, the LiTaO$_3$ crystal structure belongs to the trigonal system, point group 3m. Therefore, Euler angle dependence of each characteristic is similar between LiNbO$_3$ and LiTaO$_3$. Therefore, even when using LiTaO$_3$, the range of Euler angles which is similar to the above-described Euler angles may be preferable.

If Euler angles ($\phi$, $\theta$, $\varphi$) for LiNbO$_3$ and LiTaO$_3$ in preferred embodiments of the present invention are equivalent to each other in terms of crystallography, any configuration may be used. For example, according to the document (Nihon Onkyo gakkai (Journal of Acoustical Society of Japan) vol. 36, No. 3, pp. 140 to 145, 1980), LT and LN are crystals belonging to the trigonal system, point group 3m. Therefore, the following expressions hold.

$$F(\phi, \theta, \varphi) = F(60° + \phi, -\theta, \varphi)$$
$$= F(60° - \phi, -\theta, 180° - \varphi)$$
$$= F(\phi, 180° + \theta, 180° - \varphi)$$
$$= F(\phi, \theta, 180° + \varphi)$$

F represents any characteristic of elastic waves, such as the electromechanical coupling coefficient, the propagation loss, the temperature coefficient of resonant frequency (TCF), the power flow angle, or the natural unidirectionality. Therefore, Euler angles (about 90°, about 90°, about 40°) described in the first experimental example is equivalent to (about 30°, about 90°, about 140°).

In the case in which AlN, ZnO, ScAlN or other suitable material is used as a piezoelectric body, as the orientation in which the S0 mode is strongly excited, the c-axis oriented surface and the orientation in which the c axis is parallel or substantially parallel to the elastic-wave propagation direction are known and used. In the case in which AlN is used as a piezoelectric body, the S0 mode is excited at and near an acoustic velocity of about 8000 to about 10000 m/s. In the case in which a piezoelectric body is made of AlN, if the acoustic velocity obtained by using the method described above is about 8000 to about 10000 m/s, it is recognized that the S0 mode is used.

In the preferred embodiments described above, the one-port elastic wave resonator is described. Preferred embodiments of the present invention may applied to a pass band elastic wave filter including the elastic wave resonator. In this case, as the operating frequency of the elastic wave device, the center frequency of the pass band of the elastic wave filter may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device using an S0 mode of a plate wave, the elastic wave device comprising:
   a support substrate;
   an acoustic reflective layer laminated directly or indirectly on the support substrate;
   a piezoelectric body laminated directly or indirectly on the acoustic reflective layer; and
   an IDT electrode disposed directly or indirectly on the piezoelectric body; wherein
   the acoustic reflective layer includes:
     at least one low acoustic impedance layer with an acoustic impedance that is relatively low; and
     at least one high acoustic impedance layer with an acoustic impedance that is higher than the at least one low acoustic impedance layer;
   in the acoustic reflective layer, T1+T2 is between about 0.40 and about 0.60 inclusive in at least one portion in which the at least one low acoustic impedance layer is adjacent to the at least one high acoustic impedance layer in a laminating direction, where T1 is a thickness of the at least one low acoustic impedance layer and T2 is a thickness of the at least one high acoustic impedance layer, the thickness of the at least one low acoustic impedance layer being normalized by a thickness-direction component of a wavelength of a traverse bulk wave propagating in the at least one low acoustic impedance layer at an operating frequency of the elastic wave device, the thickness of the at least one high acoustic impedance layer being normalized by a thickness-direction component of a wavelength of a traverse bulk wave propagating in the at least one high acoustic impedance layer at the operating frequency of the elastic wave device;

T1/(T1+T2) is between about 0.35 and about 0.65 inclusive;

the piezoelectric body is made of lithium niobate; and

Euler angles of the piezoelectric body are substantially (within a range of about 0°+5°, about 0° to about 150°, within a range of about 90°+10°), (within a range of about 30°±5°, within a range of about 90°+10°, about 35° to about 180°), or (within a range of about 30°+5°, within a range of about 90°+10°, about 0° to about 5°).

2. The elastic wave device according to claim 1, wherein the elastic wave device is an elastic wave resonator, and the operating frequency of the elastic wave device is a resonant frequency of the elastic wave resonator.

3. The elastic wave device according to claim 1, wherein the elastic wave device is a band pass elastic wave filter, and the operating frequency of the elastic wave device is a center frequency of a pass band of the elastic wave filter.

4. The elastic wave device according to claim 1, wherein the at least one low acoustic impedance layer includes a plurality of low acoustic impedance layers.

5. The elastic wave device according to claim 1, wherein the at least one high acoustic impedance layer includes a plurality of high acoustic impedance layers.

6. The elastic wave device according to claim 4, wherein the plurality of low acoustic impedance layers have a same or substantially same acoustic impedance.

7. The elastic wave device according to claim 5, wherein the plurality of the high acoustic impedance layers have a same or substantially same acoustic impedance.

8. A radio-frequency front-end circuit comprising:

an elastic wave filter including the elastic wave device according to claim 1; and a power amplifier connected to the elastic wave filter.

9. The radio-frequency front-end circuit according to claim 8, wherein the at least one low acoustic impedance layer includes a plurality of low acoustic impedance layers.

10. The radio-frequency front-end circuit according to claim 8, wherein the at least one high acoustic impedance layer includes a plurality of high acoustic impedance layers.

11. The radio-frequency front-end circuit according to claim 9, wherein the plurality of low acoustic impedance layers have a same or substantially same acoustic impedance.

12. The radio-frequency front-end circuit according to claim 10, wherein the plurality of the high acoustic impedance layers have a same or substantially same acoustic impedance.

13. A communication apparatus comprising:

a radio-frequency front-end circuit including an elastic wave filter including the elastic wave device according to claim 1;

a power amplifier connected to the elastic wave filter; and an RF signal processing circuit.

14. The communication apparatus according to claim 13, wherein the at least one low acoustic impedance layer includes a plurality of low acoustic impedance layers.

15. The communication apparatus according to claim 13, wherein the at least one high acoustic impedance layer includes a plurality of high acoustic impedance layers.

16. The communication apparatus according to claim 14, wherein the plurality of low acoustic impedance layers have a same or substantially same acoustic impedance.

* * * * *